United States Patent
Thomsen

(10) Patent No.: US 10,620,269 B2
(45) Date of Patent: Apr. 14, 2020

(54) PITCH SYSTEM AND METHOD FOR TEST OF A POWER BANK AND USE OF THE PITCH SYSTEM FOR PERFORMING THE METHOD

(71) Applicant: DEIF A/S, Skive (DK)

(72) Inventor: Jesper Thomsen, Outrup (DK)

(73) Assignee: DEIF A/S, Skive (DK)

( * ) Notice: Subject to any disclaimer, the term of this patent is extended or adjusted under 35 U.S.C. 154(b) by 275 days.

(21) Appl. No.: 15/578,650

(22) PCT Filed: Jun. 27, 2016

(86) PCT No.: PCT/EP2016/064809
§ 371 (c)(1),
(2) Date: Nov. 30, 2017

(87) PCT Pub. No.: WO2017/001321
PCT Pub. Date: Jan. 5, 2017

(65) Prior Publication Data
US 2018/0172775 A1    Jun. 21, 2018

(30) Foreign Application Priority Data
Jul. 1, 2015    (DK) .................................. 2015 70425

(51) Int. Cl.
*G01R 31/367* (2019.01)
*G01R 31/389* (2019.01)
(Continued)

(52) U.S. Cl.
CPC ............ *G01R 31/367* (2019.01); *F03B 3/145* (2013.01); *F03D 7/0224* (2013.01); *F03D 17/00* (2016.05);
(Continued)

(58) Field of Classification Search
CPC ........ F03D 7/0224; F03D 80/82; F03D 17/00; F05B 2260/76; F05B 2260/80;
(Continued)

(56) References Cited

U.S. PATENT DOCUMENTS

2007/0024227 A1    2/2007    Kunkel
2007/0090797 A1    4/2007    Glosser
(Continued)

FOREIGN PATENT DOCUMENTS

WO    2013/182439    12/2013

OTHER PUBLICATIONS

International Search Report issued in PCT/EP2016/064809 dated Sep. 16, 2016, pp. 1-3.
(Continued)

*Primary Examiner* — Mischita L Henson
(74) *Attorney, Agent, or Firm* — Jeffrey S. Melcher; Melcher Patent Law PLLC

(57) ABSTRACT

Pitch system (1) comprising at least one pitch motor drive (3) connected an electrical network (5). Each pitch motor drive (3) is connected to a power bank, and the pitch system comprises a test module adapted to be activated in a test position. The test module comprises a brake module (8) each connected to a pitch motor drive (3), and each brake module (8) is adapted to load a pitch motor drive (3) with a certain load Rb. Hereby a voltage drop takes place over the power bank (6). The power bank (6) is separated into a number of power blocks (9) and the voltage drop ΔV of each power block (9) is adapted to be registered by the test module when the brake module (8) is activated.

15 Claims, 3 Drawing Sheets

(51) Int. Cl.
F03D 7/02 (2006.01)
F03D 17/00 (2016.01)
F03D 80/80 (2016.01)
F03B 3/14 (2006.01)
G01M 15/14 (2006.01)

(52) U.S. Cl.
CPC .......... F03D 80/82 (2016.05); G01R 31/389 (2019.01); F05B 2260/76 (2013.01); F05B 2260/80 (2013.01); F05B 2260/83 (2013.01); F05B 2270/107 (2013.01); G01M 15/14 (2013.01); Y02E 10/723 (2013.01)

(58) Field of Classification Search
CPC .......... F05B 2260/83; F05B 2270/107; G01R 31/389; G01R 31/367; Y02E 10/723; G01M 15/14; F03B 3/145
See application file for complete search history.

(56) References Cited

U.S. PATENT DOCUMENTS

2009/0314615 A1\* 12/2009 Christensen ............ H01H 3/26
200/17 R
2012/0056429 A1 3/2012 Hagedorn
2012/0063900 A1 3/2012 Kestermann
2015/0008883 A1 1/2015 Rosmann

OTHER PUBLICATIONS

International Preliminary Report on Patentability issued in PCT/EP2016/064809 dated Jun. 16, 2016, pp. 1-18.

\* cited by examiner

PITCH SYSTEM AND METHOD FOR TEST OF A POWER BANK AND USE OF THE PITCH SYSTEM FOR PERFORMING THE METHOD

The invention relates to a pitch system for a wind turbine or a marine energy installation comprising at least one pitch motor drive, each pitch motor drive is adapted to communicate with units comprising a motor—which is connected to the pitch motor drive—for positioning of a rotor blade, said pitch motor drive(s) is/are connected to an electrical supply network, and each pitch motor drive is coupled to a DC-power bank, said pitch system comprises a test module adapted to be activated in a test position of the pitch system, said test module comprises brake module(s) each connected to a pitch motor drive, and each brake module is adapted to load a pitch motor drive, by which a voltage drop is provided over the power bank, and that the test module comprises an algorithm adapted to calculate a capacitance value based on measured values and that the pitch motor drive is exposed for a load/resistance Rb.

The invention also relates to a method for testing a replaceable DC-power bank belonging to a pitch system for a wind turbine or a marine energy installation, said pitch system comprises at least one pitch motor drive adapted to communicate with connected units including a motor, connected to the pitch motor drive for positioning a rotor blade, said pitch motor drive(s) is/are connected to a supply network and that each pitch motor drive is connected to the power bank and a test position is provided, and that the supply network is disconnected; that the test module—comprising brake loads each connected to a pitch motor drive—is activated, and that the test module comprising an algorithm calculates a capacitance value determined from measured values, and the pitch motor drive is loaded with a load Rb.

Pitch system for pitching rotor blades of wind turbines in relation to the wind or rotor blades of marine energy installations in relation to the water flow for the recovery of underwater energy are used in such a way, that the rotor blades are pitched in an optimal angle in relation to the wind, alternative the water flow load. It is important that the wings of the plant may be turned/pitched and adjusted correct. For instance, if the rotor blades of a wind turbine must be stopped each rotor blade is pitched in such a way, that the leading edge of each rotor blade is facing forward towards the wind whereby the rotor blades of the wind turbine are stopped. The adjustment of each rotor blade takes place independently of the other rotor blades.

Power from an electrical power supply/a grid is used for adjustment or for slowing down which takes place by rotating the rotor blade about a longitudinal axis/pitch axis. Therefor it is important that the rotor blade at any time is ensured that a power supply is able to take place. However, the problem is that the grid may be interrupted, whereby the adjustment or the stopping of the rotor blade is made impossible. In this situation, there is a risk that the wind turbine is out of control.

Therefor a power bank—preferably in the form of rechargeable batteries—is connected to each pitch motor. It is important those batteries have a capacity that makes it possible to pitch the rotor blade by using the power bank if the grid is interrupted.

Therefor it is also important, that the power bank is tested now and then in order to control the capacity. This is done by braking the wind turbine/marine plant and afterwards testing the batteries. This may be done by pitching the rotor blades exclusively by using the power from the batteries. If the pitching fails, you know that the batteries are defective, and/or the capacity is too low. A consequence is that all the batteries are replaced. As each pitch motor is connected to many batteries—typically for lead batteries the amount is 24—the replacement is a very expensive and inconvenient process for ensuring that the emergency power supply will work by failure of the grid.

It is also known to use a system comprising a surveillance system that automatically changes an operation mode to a test mode of the pitch motor. In the test mode, the condition of the rotor blades is tested by loading the motor with a certain value.

However, the system is not suitable for determining which of the batteries that are defect and have to be replaced due to the fact that the voltage and the current is measured for the entire power bank. Further, the system is only suitable to be used together with a DC motor. Furthermore, both the motor and the brake load are switch in at the same time, and the moment/torque of the motor is measured and being a part of the total measurement as the current of the motor may vary. This also makes the measurement unreliable.

US2012/0063900 discloses a pitch system comprising at least a pitch motor drive adapted to communicate with a motor, which is connected to the pitch motor drive for positioning the rotor blade. The pitch motor drive is connected to a grid and a rechargeable power bank. It comprises a test module adapted to be activated in a test position and comprises a brake module loading the pitch motor drive by said loading a drop in the voltage is provided.

However, the power bank is not separated into modules and therefor it is not possible to detect an error of a specific module and replace such a module. Instead, all the batteries have to be replaced when an error has been registered. The current alternatively the voltage is observed through a time period and the time is measured and registered. Making a registration of time and read the parameters in question is not a specific reliably and precise measurement technique and will result in that the measured values of current and alternatively the voltage are defective. Further, the test takes place through a long time period.

WO2013/182439 discloses a system where the power bank is separated into modules and the internal resistance of a module is determined. The purpose of determining the internal resistance seems to be getting an indication of the state of the battery module and is primary to be used in the automobile industry. However, the described method gives a very rough indication of the state of the battery-module. Further, it does not give an error signal when a certain resistance value is detected. Thus, the technology is inapplicable for surveillance of a power bank for wind turbines and for marine energy installation.

The present invention seeks generally to improve today's pitch systems such that the abovementioned insufficiencies and drawbacks of today's pitch systems are overcome or at least the invention provides a useful alternative.

According to the invention, a pitch system is provided, as per the introductory part of this specification, and wherein the power bank is divided into a number of separated and electrical connected power blocks, and that a voltage drop $\Delta V$ of each power block is adapted to be registered by the test module when the brake module is activated and is loading a pitch motor drive with the load/resistance Rb and just prior to the load Rb is removed, and that the test module comprises an algorithm adapted to convert the voltage drop $\Delta V$ to a resistance value $Ri_x$ and a capacitance value $Ci_x$ for each power block having the number x, and that the test module is adapted to report an error for a power block having the number x when the $Ci_x$ og $Ri_x$ values of the block deviate from predefined intervals [Ci'; Ci"] og [Ri'; Ri"], said end-values of the intervals comprise a capacitance value Ci and a resistance value Ri for the entire power bank.

The power bank is separated into modules each being tested, whereby it is possible to find the module/the block that is defect, or which is evaluated soon to be defect, and as a consequence of that would supply with insufficient electricity if/when the grid fails. When the grid fails the replaceable power bank must take over in order to pitch the rotor blades using the pitch system. Is an error of the power bank reported by the test module, it means that a replacement of the battery block must take place before the energy supply is so week that the power bank would fail in the situation where it actually should have taken over the electricity supply from an interrupted grid. In this way, a replacement of the entire power bank is avoided and further it is possible to identify any risks of failure in the emergency power supply.

The test module is only activated for testing when an interruption occurs of the grid.

The pitch motor drive is a unit, each connected to a motor, and the motor controls a rotor blade through a pitch axis. The pitch motor drive controls the brake and monitor the system as such among these: input and output, the voltage, the phase situation, temperature. It also comprises a security program in such a way that if an error is reported it regulates the rotor blade it is connected to, to the position called "vane position". Hereby the rotor blade is stopped.

The brake may be an integrated part of the pitch motor drive or it might be a component placed outside the pitch motor drive. The pitch motor may be of the type AC or DC, synchronic, with or without magnets or asynchrony. The motor is a part of the pitch system.

By registration of the voltage drop over each power block, it is possible to calculate what the resistance $Ri_x$ and the capacitance $Ci_x$ is for each power block through an algorithm. The units $Ri_x$ and $Ci_x$ are very reliably units for evaluating the capacity of each power block and thereby its ability to deliver current if the grid fails. Ci' and Ci" comprises the capacitance values Ci for the entire power block assessed a deviation factor, and Ri' and Ri" comprises the resistance value Ri for the entire power block assessed a deviation factor.

Is an error reported related to one of the blocks, this means that the values of the capacitance and of the resistance are placed outside the limit value, and the block in question must be replaced.

By "just prior to" is to understand that the voltage drop $\Delta V$ is registered just before the load is removed, that is around 1/100 sec before the load is removed.

In another embodiment, the power bank comprises replaceable batteries and that the power bank is divided into a number of power blocks each comprising a number of serial connected batteries.

The batteries are typical reloadable lead batteries. In addition, other batteries such as lithium batteries or ultracaps may be used.

It is important that that the batteries are divided into blocks, and that the total voltage of each block, for example by including the same number and type of batteries in principle is the same, unless there is an error on a block.

The power blocks are connected in series with each other.

It is noted that the batteries does not age with the same rate, and external conditions such as temperature has an impact on the capacity of the batteries. Each power block is adapted to ad substantially the same voltage value as the other power blocks when the power blocks are without errors/are healthy.

In another embodiment the algorithm is adapted to compare the resistance value $Ri_x$ and the capacitance value $Ci_x$ for each power block having the number x, with corresponding values for the remaining power blocks and that the test module is adapted to report an error when the $Ri_x$ and the $Ci_x$ values of a power block is different form a predefines deviate value $\Delta Ai$ between the power blocks.

Thereby an extra precaution for the power bank is incorporated with the ability to safely define a defective block.

In another embodiment, the resistance value $Ri_x$ for each power block is converted to a corresponding resistance value by an algorithm at a predefined temperature.

The temperature used as a starting point is 20° C. By incorporating the temperature in the algorithm, it is taken into consideration that the resistance value depends on the temperature conditions. As the batteries in a wind turbine may be placed in areas down to 30° C. below zero and up to 60° C. warm it is appropriate that the resistance is normalized in relation to the calculations that takes place. The capacitance is for most batteries compensated as a function of the temperature.

In another embodiment, the pitch system comprises at least two pitch motor drives advantageously it comprises three pitch motor drives, each adapted to surveille and control units such as the motor for pitching the rotor blade. The system is typically used for wind turbines comprising 3 wings but may off course also be used for wind turbines comprising fewer for example 2 wings. Similarly, the system can be used in constructions that utilize water flow energy.

In another embodiment, the load/resistance Rb is a predefined resistance-value.

By predefined resistance-value is to understand that the load (in the form of for example a brake) is a well-defined value that is: known and unambiguous and known before the resistance is activated.

In another embodiment, the voltage drop $\Delta V$ of each power block is adapted to be registered by the test module, in the interval from the brake module is activated and is loading the pitch motor drive with the load/resistance Rb and just prior to the load Rb is removed, which is until 1/100 sec.-5/100 sec before the load Rb is removed.

According to the invention, a method is provided, as per the introductory part of this specification, and wherein the power bank is divided into a number of separate and electrical connected power blocks, that the voltage drop $\Delta V$ of each power blocks is registered by the test module, when the load is activated and just prior to the Rb is removed, and that the test module by an algorithm is calculating a resistance value $Ri_x$ and a capacitance value $Ci_x$ for each power block based on $\Delta V$, and that the test module is reporting an error for a power block, when the $Ci_x$ and $Ri_x$ values of the power block deviates from predefined intervals [Ci'; Ci"] and [Ri'; Ri"], said end-values of the interval comprise a capacitance value Ci and a resistance value Ri for the entire power bank.

In another embodiment, the power bank comprises replaceable batteries, and that the power bank is divided into a number of power blocks each comprising serial connected batteries, and that each power block supplies a voltage which is approximately the same as the other power blocks when the blocks are in faultless condition, and the test module measures the voltage drop $\Delta V$ across each energy block.

In another embodiment, the algorithm compares the resistance value $Ri_x$ and the capacitance value $Ci_x$ for each power block with a similar value for the other power blocks, and that the test module reports an error when a $Ri_x$ and $Ci_x$ value of a power block is different form a predefined deviation value $\Delta Ai$ between the power blocks, and that the power block in question is replaced with a new power block.

In another embodiment, the test module is activated after a specific time interval whereby a message concerning the power state of each battery block is activated.

In another embodiment, the brake module is loading the motor at a normal operation of the pitch system.

In another embodiment the interval values Ri',Ri" and Ci',Ci" are determined by empiric data or by measuring the voltage drop $\Delta Vi$ of the entire power bank, and based on that, average acceptable values are calculated for each power block.

In another and preferred embodiment, the motor(s) for pitching the rotor blade(s) is/are AC motor(s)

Under certain circumstances, the motor may be a DC motor

In another embodiment, the power bank is exposed for a time-short load before the test module is activated whereby a truthful start position for the module is provided.

In another embodiment, the value of the load/resistance Rb is defined before the load/resistance Rb is activated and is loading the pitch motor drive.

In another and preferred embodiment, the voltage drop $\Delta V$ of each power block is registered by the test module, in the interval running from the brake module is activated and is loading the pitch motor drive with the load/resistance Rb and just prior to the load Rb is removed, which is until 1/100 sec.-5/100 sec before the load Rb is removed.

The invention relates to use of the pitch system according to the claims and to the method according to the claims.

The invention will be explained with reference to the drawing.

Figure 4:
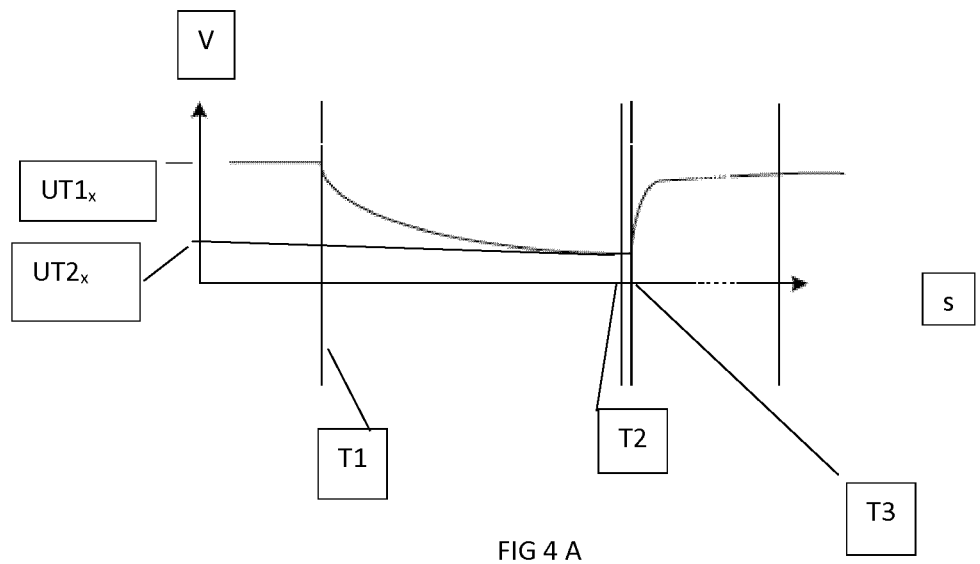
Figure 4:
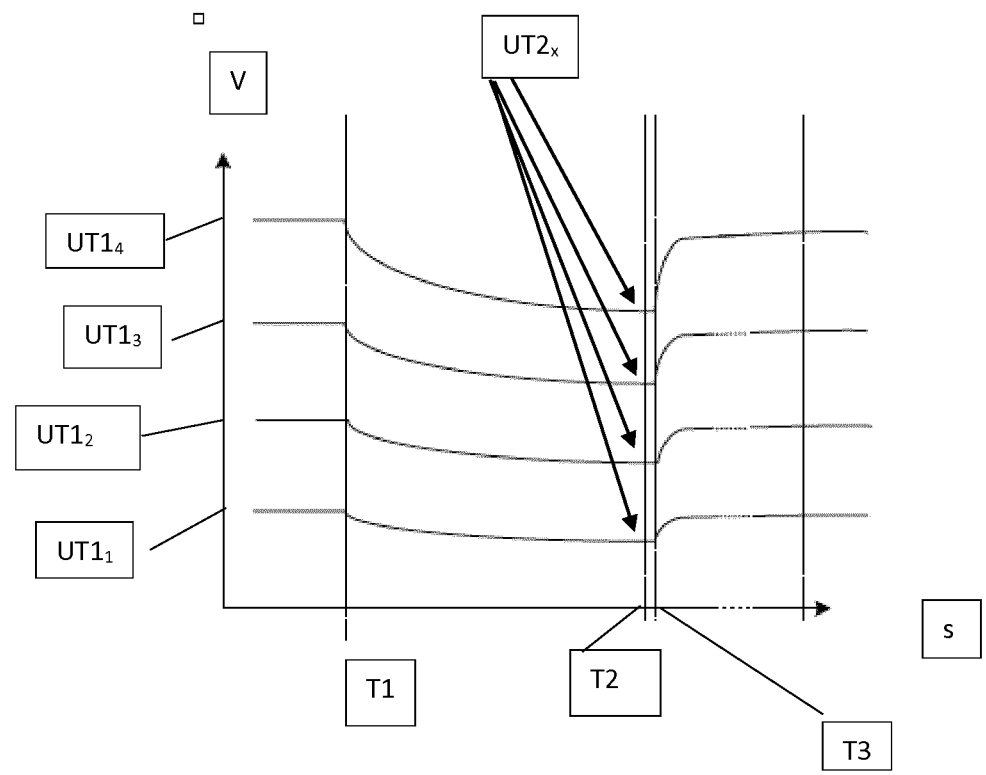

FIGS. 4A and B show a diagram for the voltage drop when the brake module is activated.

Figure 1:
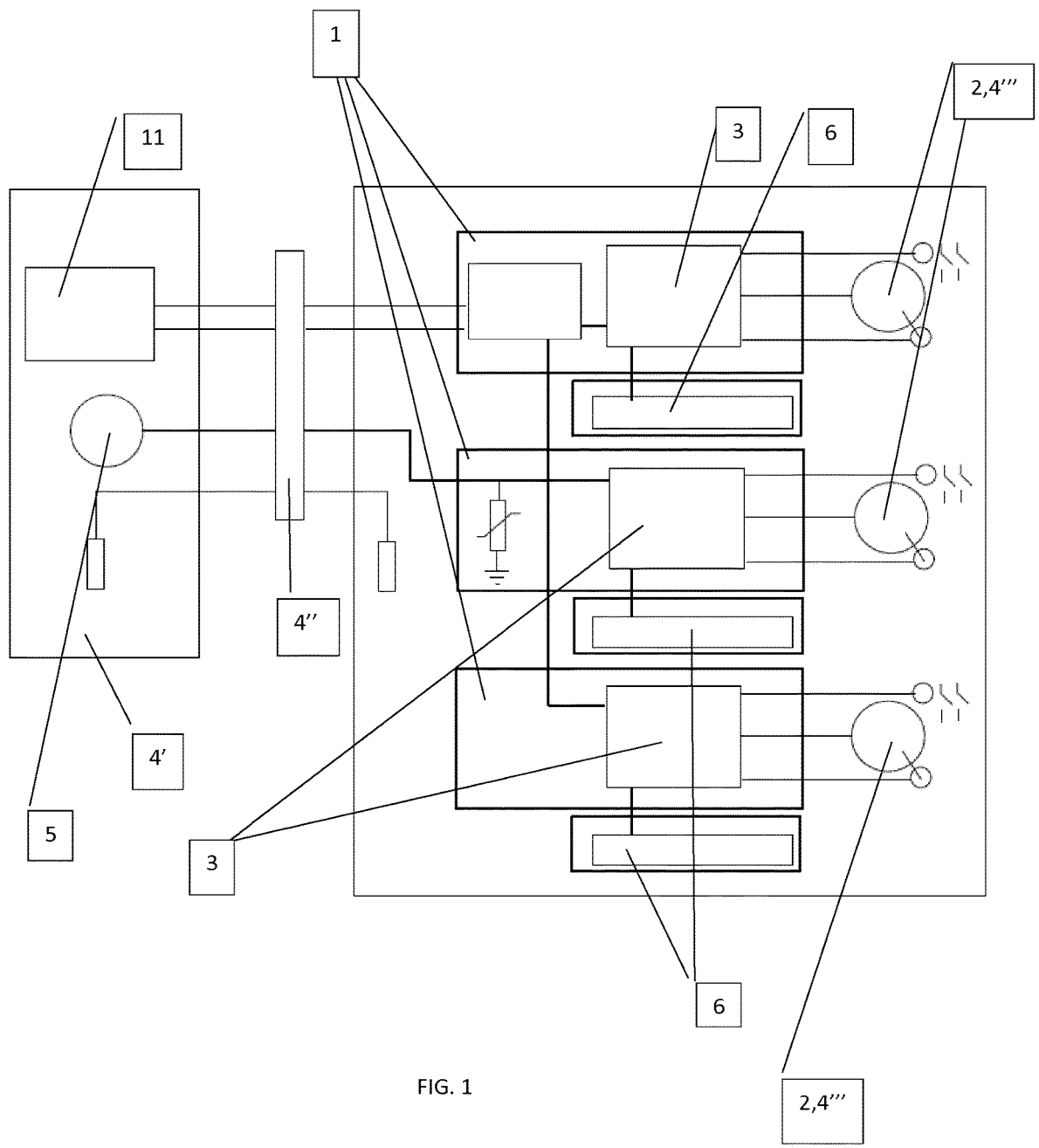
FIG. 1 shows a pitch system according to the invention and external units connected to the pitch system

FIG. 1 shows a pitch system 1 according to the invention. The pitch system 1 is connected to a number of units. 4',4", 4"'. The pitch system 1 is shown in connection with a system for driving a wind turbine comprising three rotor blades but could also be used for a system for driving a wind turbine comprising 2 rotor blades or a system used for off shore installations. The pitch system 1 comprises three pitch motor drives 3 as a consequence of being shown for a wind turbine comprising three rotor blades. Each pitch motor drive 3 is connected to a motor 4''',2 and a replaceable power bank 6. Typically, the power bank 6 comprises reloadable batteries such as lead batteries, lithium batteries or ultra-caps. Each power bank 6 connected to a pitch motor drive 3 is separated into blocks 9 as explained below.

The pitch system 1 communicates with a slip ring 4"'—a unit that transfers electrical signals and power from a fixed part to a rotating part, and a nacelle 4' comprising a main controller 11 and a supply network 5.

Each electrical motor 2—an actuator—moves a rotor blade (not shown at the figure). A typically wind turbine has as mentioned three rotor blades which causes the number of individual driven motors 2 to be three. The electrical pitch system 1 has an interface to the electrical system of the nacelle 4' and receives an electrical current from the grid 5 in order to drive the motors 2/the rotor blades.

The pitch system 1 has two primary functions, one is the normal operation where the pitch system 1 is used to optimize the regulation of the rotor blades in all wind/flow situations and the other is to brake the rotor blades. This brake function takes place by moving the rotor blade away from the operation area—which is from 0° to 30° depending on the actual average wind speed—to a vane position, this is 90°. In this situation, the leading edge is facing the wind/wave direction. The three motors must be controlled individually and independent of each other.

Figure 2:
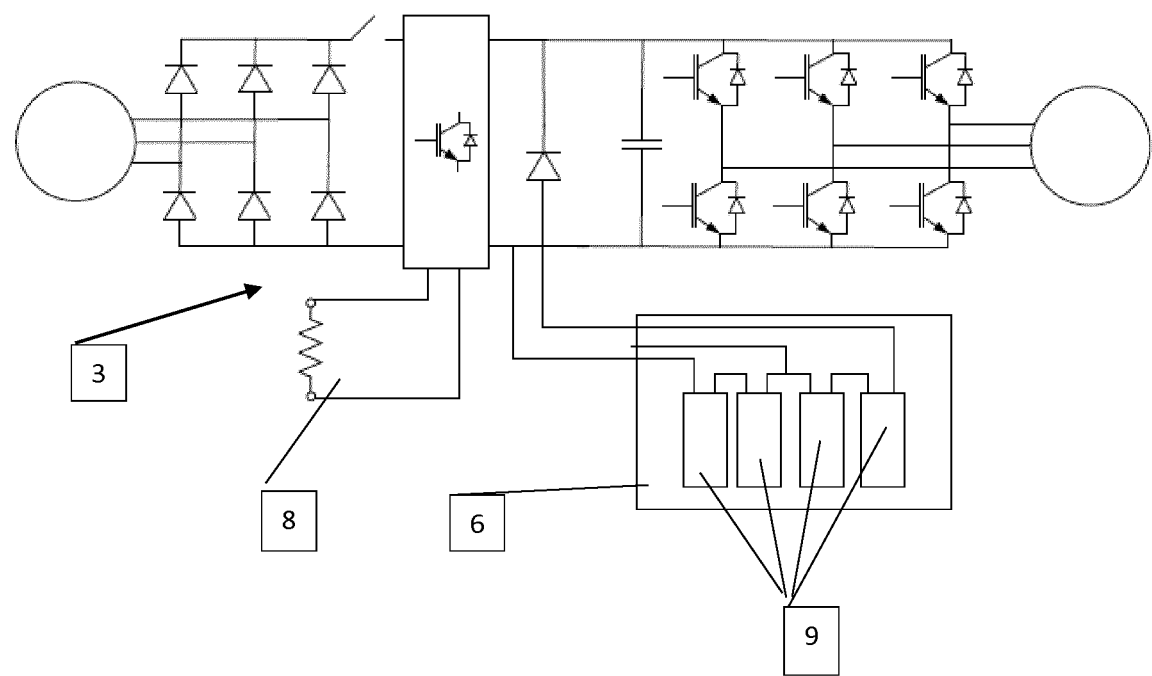
FIG. 2 shows a sub element of FIG. 1 comprising, inter alia, a pits motor drive and a brake.

FIG. 2 shows a sub element of FIG. 1 comprising, inter alia, a pitch motor drive 3 and a brake 8. The pitch motor drive 3 is connected a power bank 6 which in this example is divided into four energy blocks 9, namely, block 1, block 2, block 3, block 4. The power bank 6 is a replaceable power bank, and when it is divided into a number of blocks 9—whose resistance $Ri_x$ and capacitance $Ci_x$ can be calculated from the voltage drop $\Delta V$ when the brake is applied—it is possible to identify, whether there is one of the blocks 9 that are defective and therefore needs to be replaced. Alternatively, it is possible to detect if one of the blocks 9 shortly will be defective and should be replaced before damage is done.

Figure 3:
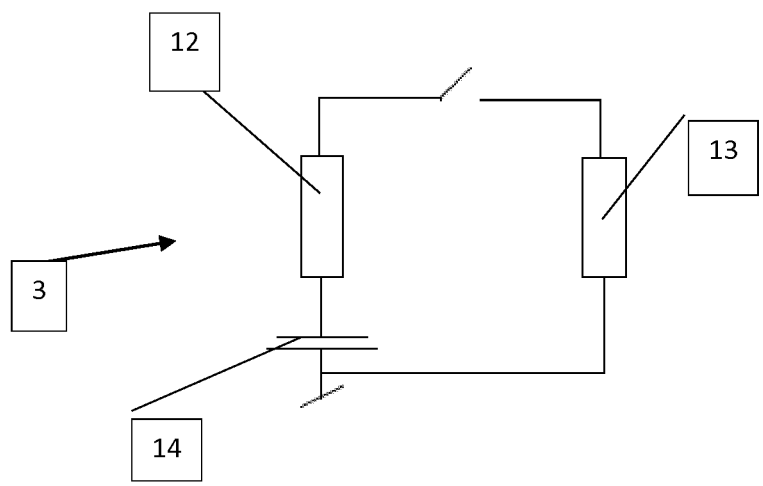
FIG. 3 shows a brake module for loading the pitch motor drive.

FIG. 3 shows a brake module 8 for loading a pitch motor drive 3. The load 13 is provided by applying a resistance Rb, after the test module has been activated and after the EL supply network has been interrupted. This results in a voltage drop $\Delta V$ of each block 1,2,3,4.

The voltage drop $\Delta V$ is registered over the interval from the moment the load Rb sets in on time T1 until time T2 that is about 1/100 seconds before time T3, which is the time when the load Rb is removed. The voltage drop $\Delta Vi$ for all the blocks is registered and the voltage drop $\Delta V$ for each single block is registered.

The voltage drop $\Delta V$ of each block 9 causes the capacitance value $Ci_x$ for each block 9 and the resistance value $Ri_x$ for each block 9 may be calculated from an algorithm:

Calculation of $Ri_x$—which is the resistance of each block with the number x—is calculated from the following:

$$Ri_x = [(UT1_x - UT2_x) * Rb]/UT2$$

Calculation of $C_{ix}$, which is the capacitance of each block with the number x—is calculated from the following:

$$Ci_x = (UT2_x - UT2_{x-i}) * UT2/[(Rb*(T3-T1)]$$

The symbols are as follows:
Ci The capacitance for the entire power bank [F]
$Ci_{,average}$ The capacitance. Average value for each block [F]
$Ci_x$ The capacitance for the block with the number x [F], X=1 . . . 4
Ri The resistance for the entire power bank [Ω]
$Ri_{,average}$ The resistance. The average value for each block [Ω]
$Ri_x$ The resistance for the block with the number x
Rb Resistance, brake/load resistance [Ω].
T1 The time where Rb is activated [s]
T2 Time for registered minimum voltage. [s]
T3 Time where Rb is removed. [s]
UT1 Voltage measured at time T1 for the entire power bank [V]
$UT1_x$ Voltage at the time T1 for block x [V], x=1 . . . 4
UT2 Voltage at the time T2 for the entire power bank [V]
$UT2_x$ Voltage at the time T2 for block x x [V], x=1 . . . 4
UT3 Voltage at the time T3 for the entire power bank [V]

The voltage drop ΔVi for all the blocks 9 causes that the capacitance value Ci for all the blocks and the resistance value Ri for all the blocks (that is the entire power bank 6) may be calculated using an algorithm:
Ci is then calculated:

$$Ci=UT2*UT2/[Rb*(T3-T1)]$$

Moreover, Ri is then calculated:

$$Ri=(UT1-UT2)*Rb/UT2$$

A mean value for each power block is then calculated:

$$Ri_{,average}: Ri/\text{number of blocks}$$

$$Ci_{,average}: Ci*\text{number of blocks}$$

Limiting values for what leads to an error message will be a certain percentage P for example, 10% of the average values for the resistance and capacitance.

When a value for P of 10% is used the error occur at Error signal:

$$Ri'=Ri_{,average}*(1+0,1) \geq Ri_x \geq Ri_{,average}*(1-0,1)=Ri''$$

$$Ci'=Ci_{,average}*(1+0,1) \geq Ci_x \geq Ci_{,average}*(1-0,1)=Ci'''$$

If one of the above two equations is not valid, there is an error to be reported.

In addition, the algorithm includes that the resistance value $Ri_x$ and the capacitance value $Ci_x$ for each power block 9 is compared with corresponding values for the other power blocks 9. The test module reports an error when the $Ri_x$ and $Ci_x$ value of a power block 9 is different from a predefined deviation value ΔAi between the power blocks 9.

FIGS. 4A and B thus shows the principle of the measurement taking place for each block and the entire block as for x=0 it is the entire block that is measures and for x=1,2,3,4 it is each single block as in this example 4 blocks are used. However, the number of blocks could off course be different: it could be more or less.

FIG. 4A shows the voltage drop for the entire block between T1 and T2 and measured between $UT1_x$ and $UT2_x$. FIG. 4B shows the voltage drop for each block 1,2,3,4 and using the nomenclature as mentioned above.

All the blocks 9 are tested using a specific load—the break resistance Rb. The load is set so that a test sequence simulates current and a time when the motor will need to position the blade to its zero position. A brake chopper starts/stops the brake.

The values for Ri, Ci, $Ri_x$ and $Ci_x$ are all saved during time in such a way that the values may be evaluated.

The resistance value Ri for each power block 9 is converted by an algorithm converted to an equivalent resistance value at a predefined temperature.

The resistance is normalized to a temperature at 20° C. which means that the specific temperature coefficient is 0,00393 1/° C. at 20° C.

This gives:

$$R_{normalized}=Ri \cdot (1+0,0039 \cdot (20-\text{temperature})).$$

By the invention a reliable test module is provide. The invention is saving costs as the batteries—which are still functional—continue to operate until they reach a level where the test module reveals they must be replaced. The invention makes the maintenance of batteries more robust and decreases the risk of malfunction and hazardous situations. A decay of important performance parameters is also monitored over time.

The invention claimed is:

1. A pitch system for identifying a defective power block in a DC-power block having a plurality of power blocks utilized in a wind turbine or a marine energy installation having at least one pitch motor drive, each pitch motor drive is adapted to communicate with units comprising a motor which is connected to the pitch motor drive for positioning of a rotor blade, each pitch motor drive is connected to an electrical supply network, and each pitch motor drive is coupled to the DC-power bank, the pitch system comprising:
   a test module configured to be activated in a test position of the pitch system that disconnects the electrical supply network from the pitch motor drive, the test module comprises:
   a brake module connected to the at least one pitch motor drive, and the brake module is configured to load a pitch motor drive with a load/resistance RB by which a voltage drop ΔV is provided in each of the power blocks,
   the test module is configured to register the voltage drop ΔV for each of the power blocks starting at activation of the brake module and loading of the pitch motor drive with the load/resistance Rb until just prior to removal of the load/resistance Rb;
   the test module is configured to convert a registered voltage drop ΔV to a resistance value $Ri_x$ for each power block having the number x,
   the test module is configured to convert a registered voltage drop ΔV to a capacitance value $Ci_x$ for each power block having the number x,
   the test module is configured to compare the resistance value $Ri_x$ and the capacitance value $Ci_x$ for each power block having the number x with corresponding values for each of the power blocks,
   the test module is configured to report an error for the defective power block having the number x for $Ci_x$ and $Ri_x$ values of the block that deviate from predefined intervals (Ci'; Ci") and (Ri'; Ri"), wherein end-values of the intervals comprise a capacitance value Ci and a resistance value Ri for the entire DC-power bank, and
   the test module is configured to report an error for the defective power block having $Ri_x$ and the $Ci_x$ values that are different from a predefined deviate value ΔAi between each of the power blocks.

2. The pitch system according to claim 1, wherein the power bank comprises replaceable batteries and that the power bank is divided into a number of power blocks each comprising a number of serial connected batteries.

3. The pitch system according to claim 1, wherein the resistance value $Ri_x$ for each power block is converted to a corresponding resistance value at a predefined temperature.

4. The pitch system according to claim 1, wherein the pitch system comprises at least two pitch motor drives each adapted to surveille and control the motor for pitching the rotor blade.

5. The pitch system according to claim 1, wherein that Rb is a predefined resistance-value.

6. The pitch system according to claim 1, the voltage drop ΔV of each power block is adapted to be registered by the test module, in the interval from the brake module is activated and is loading the pitch motor drive with the load/resistance Rb and just prior to the load Rb is removed, which is until 1/100 sec.-5/100 sec before the load Rb is removed.

7. A method for identifying and replacing a defective power block in a DC-power block having a plurality of power blocks connected to a pitch system for a wind turbine or a marine energy installation, said pitch system comprises at least one pitch motor drive adapted to communicate with connected units including a motor, connected to the pitch motor drive for positioning a rotor blade, said pitch motor drive(s) is/are connected to a supply network and each pitch motor drive is connected to the power bank, the method comprising:

provising a test module comprising a brake module connected to the at least one pitch motor drive;

activating by the test module a test position that disconnects the supply network to the pitch motor drive(s);

loading by the test module a load/resistance Rb to each pitch motor drive; registering by the test module a voltage drop $\Delta V$ for each of the power blocks from activation of the brake module and loading of the pitch motor drive with the load/resistance Rb until just prior to removal of the load/resistance Rb;

converting by the test module the registered voltage drop $\Delta V$ to a resistance value $Ri_x$ for each power block having the number x;

converting by the test module the registered voltage drop $\Delta V$ to a capacitance value $Ci_x$ for each power block having the number x;

comparing by the test module the resistance value $Ri_x$ and the capacitance value $Ci_x$ for each power block having the number x with corresponding values for each of the power blocks;

reporting by the test module an error for the defective power block having the number x for $Ci_x$ and $Ri_x$ values of the block that deviate from predefined intervals (Ci'; Cr) and (Ri'; Ri"), wherein end-values of the intervals comprise a capacitance value Ci and a resistance value Ri for the entire DC-power bank;

reporting by the test module an error for the defective power block having $Ri_x$ and the $Ci_x$ values that are different from a predefined deviate value $\Delta Ai$ between each of the power blocks; and replacing the defective power block with a non-defective power block.

8. The method according to claim 7, wherein the power bank comprises replaceable batteries and that the power bank is divided into a number of power blocks each comprising serial connected batteries and that each power block supplies a voltage which is approximately the same as the other power blocks when the blocks are in faultless condition, and the test module measures the voltage drop $\Delta V$ across each energy block.

9. The method according to claim 7, wherein the test module is activated after a specific time interval whereby a message concerning the power state of each battery block is activated.

10. The method according to claim 7, wherein the brake module is loading the motor at a normal operation of the pitch system.

11. The method according to claim 7, wherein the interval values Ri',Ri" and Ci',Ci" are determined by empiric data or by measuring the voltage drop $\Delta Vi$ of the entire power bank, and calculating average acceptable values for each power block.

12. The method according to claim 7, wherein the power bank is exposed for a time-short load before the test module is activated whereby a truthful start position for the module is provided.

13. The method according to claim 7, wherein the value of the load/resistance Rb is defined before the load/resistance Rb is activated and is loading the pitch motor drive.

14. The method according to claim 7, wherein the voltage drop $\Delta V$ of each power block is registered by the test module, in the interval running from the brake module is activated and is loading the pitch motor drive with the load/resistance Rb and just prior to the load Rb is removed, which is until 1/100 sec.-5/100 sec before the load Rb is removed.

15. Use of the pitch system according to claim 1 for performing the method according to claim 7.

* * * * *